US005444322A

United States Patent [19]

Minami et al.

[11] Patent Number: 5,444,322

[45] Date of Patent: Aug. 22, 1995

[54] ELASTIC CONVOLVER

[75] Inventors: Kunio Minami; Michio Kadota, both of Nagaokakyo, Japan

[73] Assignee: Murata Manufacturing Co., Ltd., Kyoto, Japan

[21] Appl. No.: 204,591

[22] Filed: Mar. 1, 1994

[30] Foreign Application Priority Data

| | | | |
|---|---|---|---|
| Mar. 2, 1993 | [JP] | Japan | 5-041443 |
| Oct. 21, 1993 | [JP] | Japan | 5-263770 |

[51] Int. Cl.[6] ..... H01L 41/08

[52] U.S. Cl. ..... 310/313 D; 310/313 A; 333/194; 364/821

[58] Field of Search ..... 310/313 A, 313 B, 313 C, 310/313 D; 23/821; 330/150–155, 193–196

[56] References Cited

U.S. PATENT DOCUMENTS

| | | | |
|---|---|---|---|
| 3,965,444 | 6/1976 | Willingham et al. | 310/313 A X |
| 4,484,098 | 11/1984 | Cullen et al. | 310/313 A |
| 4,511,866 | 4/1985 | Milsome | 333/194 |
| 4,567,453 | 1/1986 | Schofield | 310/313 D X |
| 4,571,519 | 2/1986 | Kawabata et al. | 310/313 A |
| 4,604,594 | 8/1986 | Angerer et al. | 333/194 |
| 4,617,487 | 10/1986 | Sone et al. | 310/313 D |
| 4,666,822 | 5/1987 | Sinha | 310/313 R X |

*Primary Examiner*—Mark O. Budd

*Attorney, Agent, or Firm*—Ostrolenk, Faber, Gerb & Soffen

[57] ABSTRACT

An elastic convolver 11 constructed by forming a set of input idts 13 spaced apart from each other by a predetermined distance on an $LiNbO_3$ piezoelectric substrate, forming a waveguide path 14 in the center of an area between the IDTs 13, respectively forming multistrip couplers 15 between the waveguide path 14 and tile IDTs 13, and forming ZnO piezoelectric thin films 16 so as to cover at least the IDTs 13 and so as not to cover the guide path 14.

13 Claims, 5 Drawing Sheets

ELASTIC CONVOLVER

BACKGROUND OF THE INVENTION

1. Field of the Invention

The present invention relates to an elastic convolver utilizing the nonlinearity of surface acoustic waves, and more particularly, to an elastic convolver utilizing a structure in which a ZnO piezoelectric thin film is deposite on a piezoelectric substrate composed of an $LiNbO_3$ piezoelectric single crystal.

2. Description of the Prior Art

An elastic convolver is one type of signal processing device utilizing the nonlinear behavior of a piezoelectric body, which is an operating device for performing convolution integration of two input signals. As this elastic convolver, a structure in which a multistrip coupler (hereinafter referred to as an MSC) is incorporated has been conventionally known. One example of this known elastic convolver is shown in FIG. 8.

The elastic convolver 1 is constructed using as a piezoelectric body a rectangular piezoelectric substrate 2 composed of an $LiNbO_3$ piezoelectric single crystal. Input interdigital transducers (hereinafter referred to as input IDTs) 3 are respectively formed in the vicinities of both end surfaces 2*a* and 2*b* of the piezoelectric substrate 2. The input IDTs 3 are constituted by a pair of comb electrodes each having electrode fingers which are inserted into each other.

Furthermore, a waveguide path 4 extending parallel to the direction of surface wave propagation is formed in the center of an area between the input IDTs 3. MSCs 5 are respectively formed between the waveguide path 4 and the input IDTs 3.

In the elastic convolver 1, if input signals are applied to the input IDTs 3, surface acoustic waves which are excited by the input signals are respectively propagated in directions indicated by arrows A and B. The surface acoustic waves are respectively compressed in the MSCs 5 and then, are overlapped with each other in the waveguide path 4, so that an output signal is taken out.

The performance of an elastic convolver is generally indicated by an efficiency F and a BT product (B represents a bandwidth and T represents integration or process time). It has been desired to improve the efficiency F and the BT product.

Since the elastic convolver utilizes surface acoustic waves as described above, it is considered that a piezoelectric substrate 2 having a large electromechanical coupling factor and having significant nonlinearity may be used in order to increase the efficiency F.

On the other hand, it is reported that when IDTs are formed on a piezoelectric substrate composed of an $LiNbO_3$ piezoelectric single crystal to excite surface acoustic waves, a ZnO piezoelectric thin film is deposited on the surface of the $LiNbO_3$ piezoelectric substrate, thereby to obtain a larger electromechanical coupling factor (an article by A. Armstrong. et al., Proc. 1972 IEEE Ultrason. Symp. pp. 370 to 372 (1972), and an article by Nakamura et al., Proceedings of Japanese Conference on Acoustics, October 1991, pp. 953 to 954).

Therefore, a ZnO piezoelectric thin film is formed so as to cover the input IDTs 3, the MSCs 5 and the waveguide path 4 on both surfaces of the piezoelectric substrate 2 in the elastic convolver 1 shown in FIG. 8 to manufacture an elastic convolver. Consequently, it is confirmed that the manufactured elastic convolver is increased in efficiency, as compared with the conventional elastic convolver 1.

However, it is confirmed that the bandwidth and particularly, the bandwidth (3 dB attenuation bandwidth) at which the amount of attenuation is decreased by 3 dB is significantly decreased, although the efficiency is increased. That is, the elastic convolver can process a signal having a wider spectrum when the bandwidth is larger. Accordingly, the large bandwidth is required. If the ZnO piezoelectric thin film is formed on the entire surface as described above, however, it is found that the bandwidth is decreased, although the efficiency is increased, which is unfavorable.

SUMMARY OF THE INVENTION

An object of the present invention is to provide an elastic convolver having a structure in which the efficiency can be increased without decreasing the bandwidth.

In accordance with a wide aspect of the present invention, there is provided an elastic convolver comprising a piezoelectric substrate composed of an $LiNbO_3$ single crystal, a set of input idts disposed spaced apart from each other by a predetermined distance on the piezoelectric substrate, a waveguide path disposed between the input IDTs, multistrip couplers respectively formed between the waveguide path and the input IDTs, and at least one of piezoelectric thin films formed on areas where at least the set of input idts is formed in the remaining area excluding a portion on the waveguide path on the piezoelectric substrate.

As the above described piezoelectric thin film, a piezoelectric thin film composed of, for example, ZnO, $Ta_2O_5$ or CdS can be used.

In the present invention, it is considered that the reason why the efficiency of the elastic convolver is increased is that the piezoelectric thin films are formed on the piezoelectric substrate composed of $LiNbO_3$ in the areas where at least the IDTs are formed as described above, so that the electromechanical coupling factor of the piezoelectric substrate is increased.

Furthermore, it is considered that it is for the following reason that the elastic convolver according to the present invention is increased in efficiency, as compared with a case where the piezoelectric thin film is formed on the entire surface of the piezoelectric substrate. Specifically, it is considered that the amount of the loss in the conventional elastic convolver 1 (see FIG. 8) is the sum of the loss in the input IDTs 3, the loss in the MSCs 5, and the loss in a surface propagation path (including a portion where the waveguide path 4 is formed). In order to decrease the loss in each of the portions, however, it is preferable that the upper surface of the portion is not coated with the piezoelectric thin film.

On the other hand, areas where the IDTs and the MSCs are formed are portions positively utilizing a piezoelectric phenomenon. Accordingly, it is conceivably preferable to increase the excitation efficiency of surface acoustic waves by depositing the piezoelectric thin films on the areas.

In the present invention, therefore, the above described piezoelectric thin films are formed on at least the input IDTs, so that it is considered that the excitation efficiency of the surface acoustic waves is increased. On the other hand, no piezoelectric thin film is formed on a surface wave propagation path which should not be preferably coated with the piezoelectric thin film and particularly, the waveguide path, so that it is considered that the propagation loss of the surface acoustic waves is decreased and the efficiency becomes higher than that in a case where the entire surface of the piezoelectric substrate is coated with the piezoelectric thin film and at the same time, the bandwidth can be prevented from being decreased.

According to the present invention, the piezoelectric thin films are formed so as to cover at least the input IDTs in an area excluding a portion on the waveguide path on the piezoelectric substrate composed of $LiNbO_3$, thereby to make it possible to provide an elastic convolver having a high efficiency without decreasing the bandwidth.

In accordance with a particular aspect of the present invention, a piezoelectric substrate composed of a Y cut Z propagation $LiNbO_3$ single crystal is used as the above described piezoelectric substrate composed of an $LiNbO_3$ single crystal. In this case, the set of input idts, the waveguide path and the multistrip couplers are formed on the +Y surface of the piezoelectric substrate. When an electrode structure including the input IDTs, the waveguide path and the multistrip couplers is thus formed on the +Y surface of the piezoelectric substrate, the electromechanical coupling factor of the piezoelectric substrate is increased, as compared with a case where the electrode structure is formed on the −Y surface. Consequently, it is possible to further increase the efficiency of the elastic convolver.

In accordance with a still particular aspect of the present invention, there is provided an elastic convolver in which letting H be the thickness of the piezoelectric thin film and $\lambda$ be the wavelength of the surface acoustic waves which are propagated, $H/\lambda$ is in the range of 0.08 to 0.3. $H/\lambda$ is set in the above described particular range, thereby to make it possible to effectively increase the electromechanical coupling factor. Therefore, it is possible to increase the efficiency of the elastic convolver.

More preferably, there is provided an elastic convolver in which the above described IDTs and the like are formed on the +Y surface of the piezoelectric substrate composed of a Y cut Z propagation $LiNbO_3$ single crystal and $H/\lambda$ is in the range of 0.08 to 0.3. This structure allows the efficiency of the elastic convolver to be increased more effectively because the IDTs and the like are formed on the +Y surface of the piezoelectric single-crystalline substrate and $H/\lambda$ is in the above described particular range.

As described in the foregoing, in the elastic convolver according to the present invention, the efficiency thereof is effectively increased. Further, if an attempt to obtain an elastic convolver having the same efficiency as that of the conventional elastic convolver in accordance with the present invention is made, it is possible to decrease the number of strips of the MSC. Therefore, it is possible to provide a smaller-sized elastic convolver.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Non-restrictive embodiments of the present invention will be described to clarify the present invention.

Figure 1:
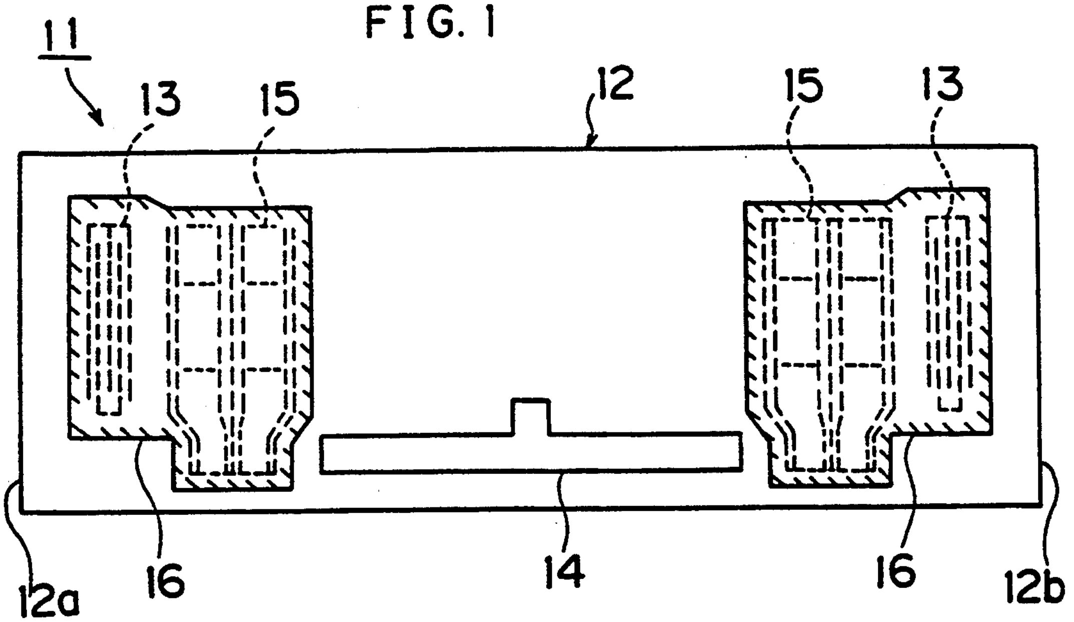
FIG. 1 is a plan view showing an elastic convolver according to a first embodiment of the present invention.

FIG. 1 is a plan view showing an elastic convolver according to a first embodiment of the present invention.

An elastic convolver 11 is constructed using a piezoelectric substrate 12 which is rectangular in plane. The piezoelectric substrate 12 is composed of an $LiNbO_3$ piezoelectric single crystal.

Figure 8:
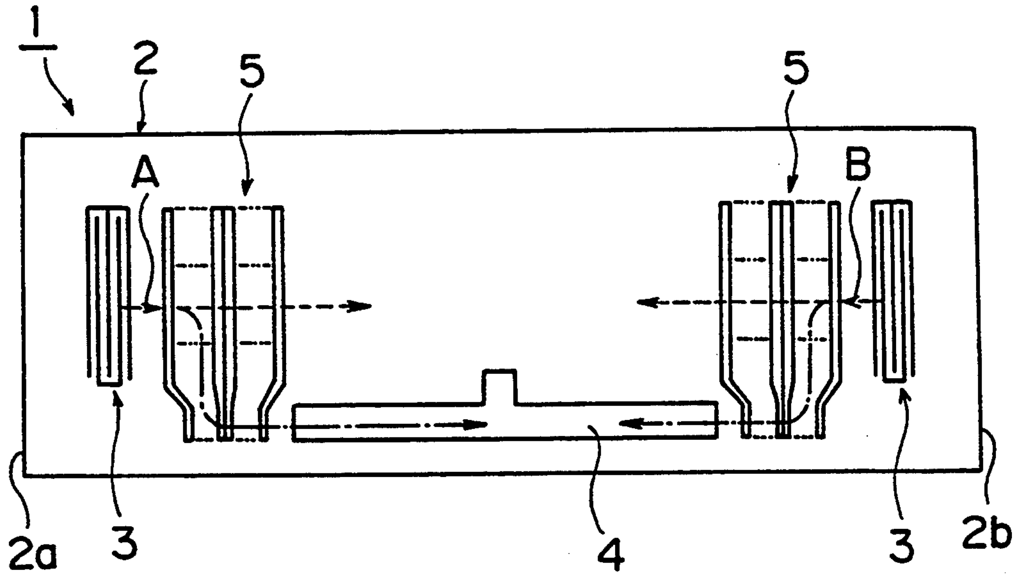
FIG. 8 is a plan view showing a conventional elastic convolver.

Input IDTs 13 are formed in the vicinities of end surfaces 12*a* and 12*b* of the piezoelectric substrate 12. The input IDTs 13 are constituted by a pair of comb electrodes each having electrode fingers which are inserted into each other. In addition, a waveguide path 14 extending parallel to the direction of surface wave propagation is formed in the center of an area between the input IDTs 13. MSCs 15 are respectively formed between the waveguide path 14 and the input IDTs 13. The foregoing is the same as that in the conventional elastic convolver 1 shown in FIG. 8.

The present embodiment is characterized in that ZnO piezoelectric thin films 16 are formed so as to cover portions where the input IDTs 13 and the MSCs 15 are formed on the upper surface of the above described piezoelectric substrate 12.

Consequently, in the elastic convolver 11 according to the present embodiment, the piezoelectric substrate 12 is coated with the ZnO thin films 16, so that the excitation efficiency of surface acoustic waves is increased. In addition, the waveguide path 14 is not coated with the ZnO piezoelectric thin film 16, so that the propagation loss on a surface wave propagation path and particularly, the waveguide path 14 is decreased. Accordingly, the efficiency of the elastic convolver 11 is increased and the bandwidth is not decreased, as compared with the conventional elastic convolver 1. This will be described with reference to FIG. 2.

Figure 2:
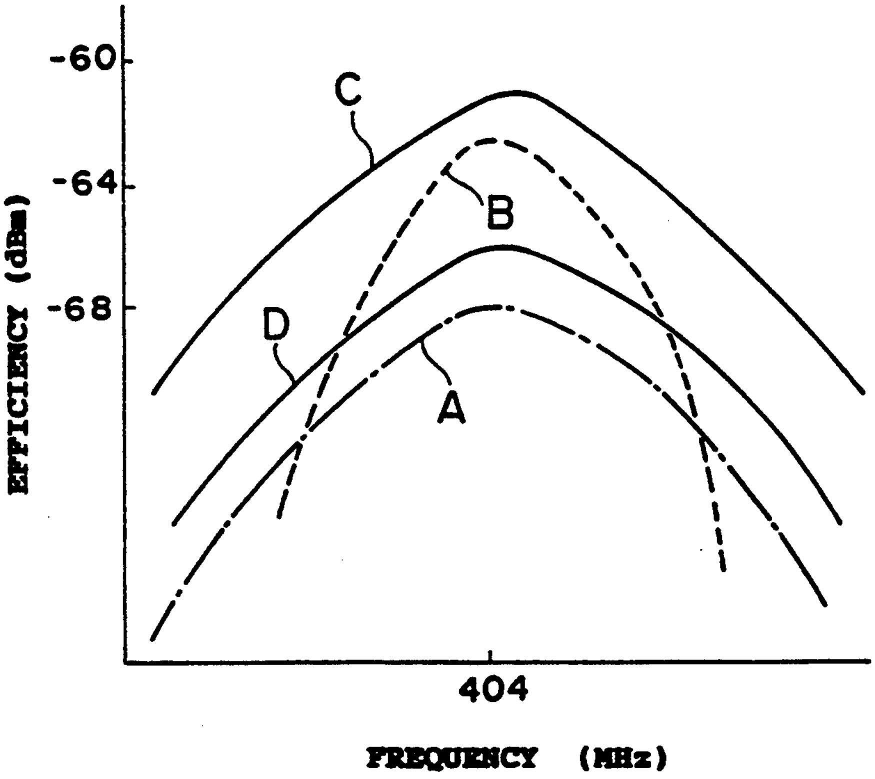
FIG. 2 is a diagram showing the efficiency-frequency characteristics of elastic convolvers in the embodiment, a conventional example and a comparative example.

FIG. 2 is a diagram showing the efficiency-frequency characteristics of elastic convolvers having various structures which are manufactured by the inventors of the instant application. In FIG. 2, a one-dot and dash line A indicates the characteristics of the conventional elastic convolver 1 shown in FIG. 8, a broken line B indicates the characteristics in a case where the ZnO thin film is formed on the entire upper surface of the piezoelectric substrate 2 in the conventional elastic convolver 1, and a solid line C indicates the characteristics of the elastic convolver 11 according to the first embodiment. As can be seen from FIG. 2, in the structure in which the ZnO piezoelectric thin film is formed on the entire upper surface of the piezoelectric substrate, the efficiency is increased, while the bandwidth is decreased, as compared with the conventional elastic convolver 1 (see the broken line B). On the other hand, in the elastic convolver according to the first embodiment, the efficiency is further increased and the 3 dB attenuation bandwidth is made sufficiently large.

Figure 3:
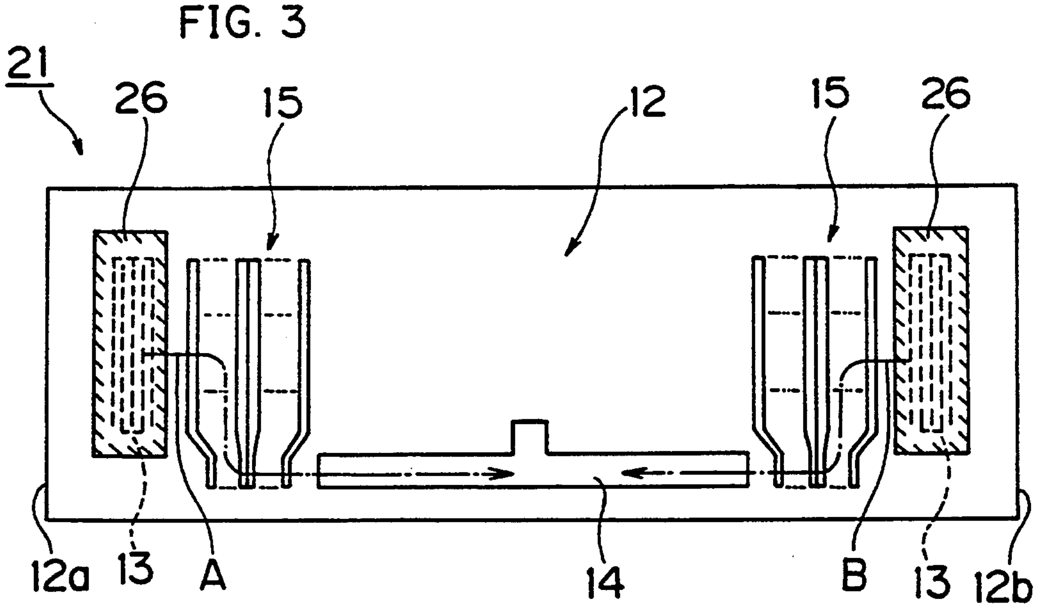
FIG. 3 is a plan view showing an elastic convolver according to a second embodiment of the present invention.

FIG. 3 is a plan view showing an elastic convolver 21 according to a second embodiment of the present invention. The elastic convolver 21 is constructed similarly to the elastic convolver 11 in the first embodiment except for only areas where piezoelectric thin films 26 composed of ZnO are formed. Consequently, the same reference numerals are assigned to portions similarly constructed and hence, the description thereof is not repeated.

In the elastic convolver 21 according to the second embodiment, the piezoelectric thin films 26 are so formed as to coat only areas where input IDTs 13 are formed on the upper surface of a piezoelectric substrate 12.

The efficiency-frequency characteristics of the elastic convolver 21 according to the second embodiment are indicated by a solid line D in FIG. 2. As can be seen from FIG. 2, even in the elastic convolver 21 according to the second embodiment, the efficiency is increased and the bandwidth is not decreased, as compared with the conventional elastic convolver 1. Consequently, the ZnO piezoelectric thin films 26 are so formed as to coat at least the input IDTs 13 as in the present embodiment, thereby to make it possible to increase the efficiency without decreasing the bandwidth.

Figure 4:
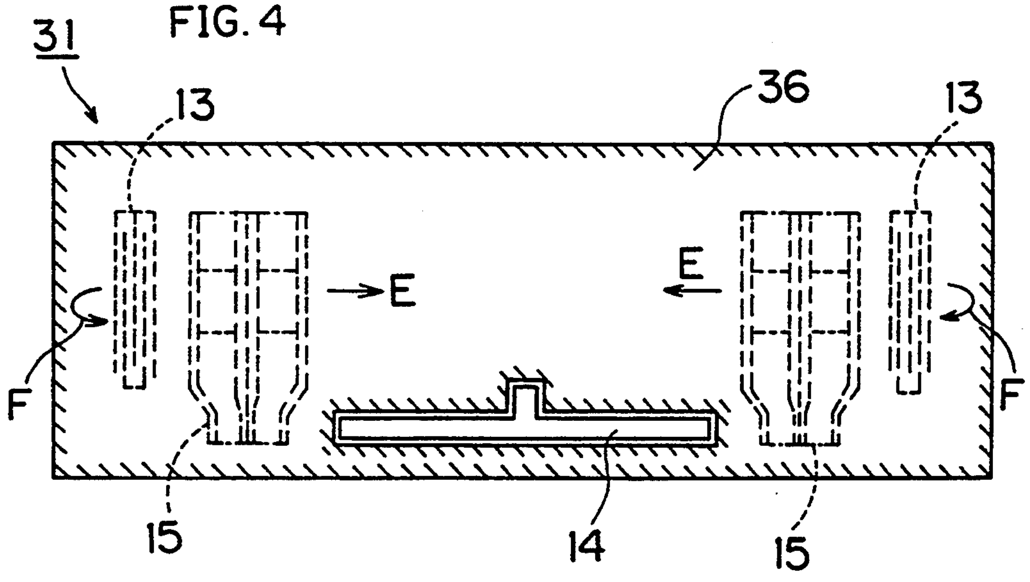
FIG. 4 is a plan view showing an elastic convolver according to a third embodiment of the present invention.

FIG. 4 is a plan view showing an elastic convolver according to a third embodiment of the present invention. The elastic convolver 31 is constructed similarly to the elastic convolver 11 according to the first embodiment except that the entire remaining area excluding a portion where a waveguide path 14 is formed and its vicinity is coated with a piezoelectric thin film 36 composed of ZnO and hence, the same reference numerals are assigned to the same portions.

As described in the foregoing, according to the present invention, the entire area excluding the portion on the waveguide path 14 may be coated with the ZnO piezoelectric thin film, thereby to make it possible to increase the efficiency without decreasing the bandwidth as in the first and second embodiments, as compared with the conventional elastic convolver 1. In a $ZnO/LiNbO_3$ deposited structure, the conversion efficiency of surface acoustic waves in IDTs and MSCs is higher, as compared with the case of the piezoelectric substrate composed of only $LiNbO_3$. Conversely, the high conversion efficiency causes interference between leaking surface acoustic waves in an area between both the MSCs 15 or ripples due to surface acoustic waves leaking outward from the IDTs 13 and reflected on end surfaces of the piezoelectric substrate to be a problem. In the elastic convolver 31 according to the third embodiment, however, the surface acoustic waves indicated by arrows E in FIG. 4 which slightly leak from the MSCs 15 can be attenuated by the above described ZnO piezoelectric thin film 36. Consequently, it is possible to decrease the interference in the area between both the MSCs 15. In addition, the surface acoustic waves indicated by arrows F in FIG. 4 which are reflected on the end surfaces are significantly attenuated by the addition of the above described ZnO piezoelectric thin film 36, thereby to make it possible to effectively decrease the unnecessary ripples due to the reflected waves.

Description is now made of an elastic convolver according to a fourth embodiment of the present invention. The elastic convolver according to the fourth embodiment is constructed similarly to the elastic convolver according to the first embodiment except that a piezoelectric material is altered and the thickness of a ZnO piezoelectric thin film is selected in a predetermined range. Consequently, a plan view of the fourth elastic convolver is the same as FIG. 1 showing the elastic convolver according to the first embodiment and hence, only the characteristics of the elastic convolver according to the fourth embodiment will be described with reference to FIG. 1.

In the elastic convolver 11 according to the fourth embodiment, a piezoelectric substrate 12 is composed of a Y cut Z propagation $LiNbO_3$ single crystal, and the surface shown in FIG. 1, that is, the upper surface is the +Y surface.

Furthermore, ZnO piezoelectric thin films 16 are formed so as to cover portions where input IDTs 13 and MSCs 15 are formed on the upper surface of the piezoelectric substrate 12. The thickness H of the ZnO piezoelectric thin films 16 is so selected that letting $\lambda$ be the wavelength of surface acoustic waves which are excited, $H/\lambda$ is in the range of 0.08 to 0.3. As apparent from the following examples of experiments, therefore, the ZnO piezoelectric thin films 16 having the thickness in the above described particular range are formed and the IDTs 13, the piezoelectric thin films 16 and the like are further formed on the +Y surface of the piezoelectric substrate 12, thereby to make it possible to effectively increase the efficiency of the elastic convolver 11, as compared with a case where the ZnO piezoelectric thin films are merely deposite.

Additionally, in the elastic convolver 11 according to the fourth embodiment, a waveguide path 14 is not coated with the ZnO piezoelectric thin films 16 as in the first embodiment, so that the propagation loss on the waveguide path 14 is decreased. Consequently, the efficiency is increased and the bandwidth is not decreased, as compared with the conventional elastic convolver 1.

The reason why the efficiency of the elastic convolver 11 is increased by forming the above described structure on the +Y surface of the piezoelectric substrate composed of a Y cut Z propagation $LiNbO_3$ single crystal in the above described fourth embodiment and setting the thickness of the ZnO piezoelectric thin films 16 in the above described particular range will be descried on the basis of the concrete examples of experiments.

Figure 5:
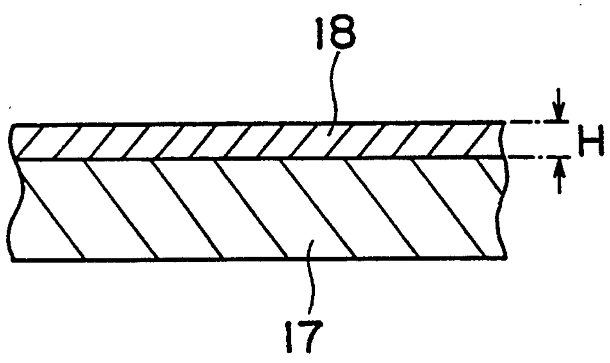
FIG. 5 is a schematic cross sectional view for explaining a structure in which a ZnO piezoelectric thin film is formed on a piezoelectric substrate composed of an $LiNbO_3$ single crystal.

As shown in FIG. 5, a structure in which a ZnO piezoelectric thin film 18 is formed on a piezoelectric substrate 17 composed of a Y cut Z propagation $LiNbO_3$ piezoelectric single crystal is prepared. In preparing the structure, a structure in which the piezoelectric thin film 18 is formed on the +Y surface as a piezoelectric substrate 17 and a structure in which a piezoelectric thin film 18 is formed on the −Y surface are prepared. In addition, structures which differ in thickness of the piezoelectric thin film 18 are prepared. Further, a pair of IDTs have been formed spaced apart from each other by a predetermined distance on the boundary surface between the piezoelectric substrate 17 and the piezoelectric thin film 18.

The velocities of surface acoustic waves and electromechanical coupling factor in the respective structures prepared in the above described manner are calculated by a method of J. J. Campbell et all (J. J. Campbell and W. R. Jone: "A method for estimating optical crystal arts and propagating directions for excitation of piezoelectric surface wave", IEEE Trans, su-15, 4, p 209 (Oct. 1968)). The results thereof are shown the relationship between the velocities and H/λ in FIG. 6., further, the relationship between an electromechanical coupling factor and H/λ in FIG. 7.

Figure 6:
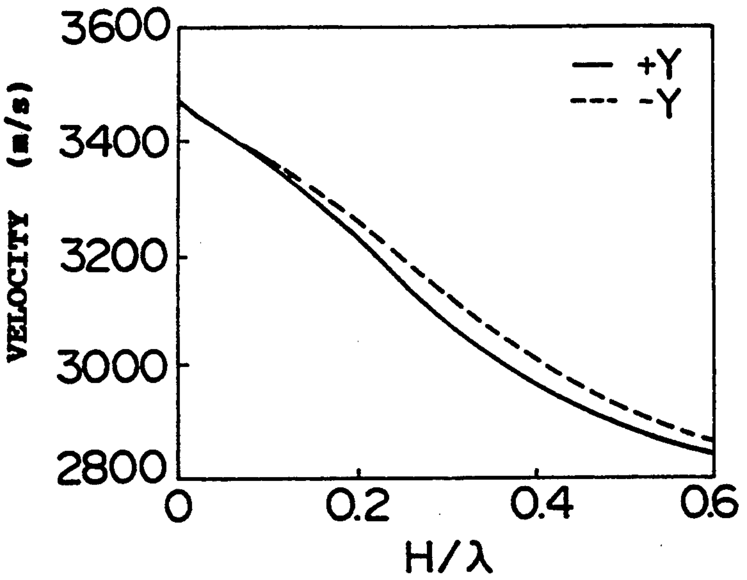
FIG. 6 is a diagram showing the relationship between the ratio $H/\lambda$ of the thickness of the ZnO piezoelectric thin film in the structure shown in FIG. 5 to the wavelength of surface acoustic waves and the velocity of the surface acoustic waves.
Figure 7:
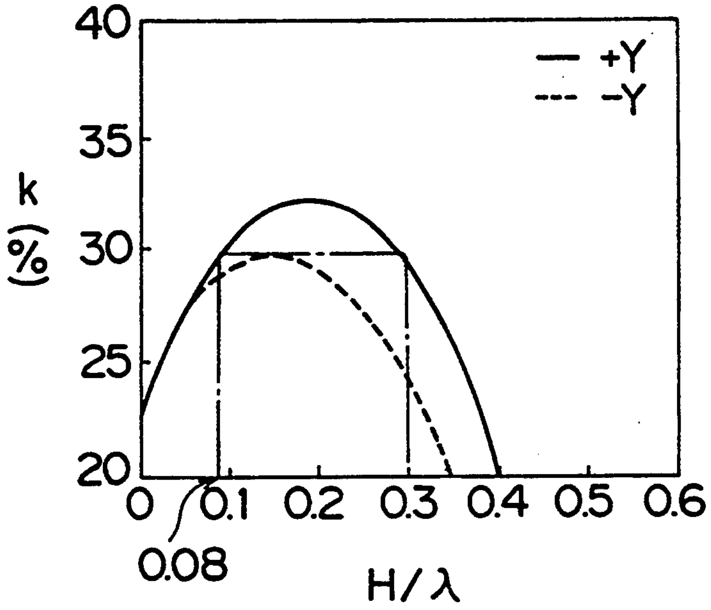
FIG. 7 is a diagram showing the relationship between the ratio $H/\lambda$ of the thickness of the ZnO piezoelectric thin film in the structure shown in FIG. 5 to the wavelength of surface acoustic waves and an electromechanical coupling factor k.

In FIGS. 6 and 7, a solid line +Y indicates characteristics in a case where the ZnO piezoelectric thin film 18 is formed on the +Y surface, and a broken line −Y indicates characteristics in a case where the piezoelectric thin film 18 is formed on the −Y surface.

As can be seen from FIGS. 6 and 7, when the ZnO piezoelectric thin film 18 is formed on the piezoelectric substrate 17 composed of a Y cut Z propagation $LiNbO_3$ single crystal, the electromechanical coupling factor is increased in a case where the ZnO piezoelectric thin film 18 is formed on the +Y surface. It is found that a large electromechanical coupling factor k which cannot be obtained in a case where the piezoelectric thin film 18 is formed on the −Y surface can be realized particularly if H/λ is in the range of 0.08 to 0.3. Consequently, the thickness of the ZnO piezoelectric thin film 18 is so selected that H/λ is in the range of 0.08 to 0.3 and the ZnO piezoelectric thin film 18 is deposite on the +Y surface of the piezoelectric substrate 17 composed of an $LiNbO_3$ single crystal, thereby to make it possible to construct an elastic convolver having a significantly high efficiency.

Although FIGS. 6 and 7 illustrate a case where the ZnO thin film 18 is formed as a piezoelectric thin film, it is confirmed by the inventors of the instant application that the efficiency of the elastic convolver can be effectively increased by forming the piezoelectric thin film on the +Y surface even when a $Ta_2O_5$ thin film or a CdS thin film is used as a piezoelectric thin film.

As described in the foregoing, in the fourth embodiment, the IDTs and the like and the above described ZnO piezoelectric thin film are formed on the +Y surface of the piezoelectric substrate composed of a Y cut Z propagation $LiNbO_3$ single crystal, thereby to further increase the efficiency of the elastic convolver, as compared with the elastic convolver according to the first embodiment. Such characteristic construction of the fourth embodiment is also applicable to the above described elastic convolvers in the second and third embodiments. That is, also in the elastic convolvers according to the second and third embodiments, the piezoelectric single-crystalline substrate is composed of a Y cut Z propagation $LiNbO_3$ single crystal, and the IDTs and the like and the piezoelectric thin film having the above described thickness are formed on the +Y surface of the piezoelectric substrate, thereby to make it possible to effectively increase the efficiency of the elastic convolvers.

Furthermore, also in the first to third embodiments, the piezoelectric thin film is not limited to the ZnO piezoelectric thin film. For example, a $Ta_2O_5$ piezoelectric thin film or a CdS piezoelectric thin film may be used.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An elastic convolver comprising:

a piezoelectric substrate composed of an $LiNbO_3$ single crystal;

a set of input interdigital transducers disposed spaced apart from each other by a predetermined distance on said piezoelectric substrate;

a waveguide path disposed between said input interdigital transducers;

multistrip couplers respectively formed between said waveguide path and the input interdigital transducers; and piezoelectric thin films formed on said piezoelectric substrate at at least areas where said input interdigital transducers are disposed, said piezoelectric thin films not being formed on said waveguide path.

2. The elastic convolver according to claim 1, wherein areas where said piezoelectric thin films are formed are areas where said set of input interdigital transducers is formed on the piezoelectric substrate.

3. The elastic convolver according to claim 1, wherein areas where said piezoelectric thin films are formed are areas where said set of input interdigital transducers and the multistrip couplers are formed on the piezoelectric substrate.

4. The elastic convolver according to claim 1, wherein said piezoelectric thin film is a piezoelectric thin film composed of one type of ZnO, $Ta_2O_5$ and CdS.

5. The elastic convolver according to claim 1, wherein said piezoelectric substrate composed of an $LiNbO_3$ single crystal is a piezoelectric substrate composed of a Y cut Z propagation $LiNbO_3$ single crystal, and said set of input interdigital transducers, said waveguide path and said multistrip couplers are formed on the +Y surface of said piezoelectric substrate.

6. The elastic convolver according to claim 5, wherein areas where said piezoelectric thin films are formed are areas where said set of input interdigital transducers is formed on the piezoelectric substrate.

7. The elastic convolver according to claim 5, wherein areas where said piezoelectric thin films are formed are areas where said set of input interdigital transducers and said multistrip couplers are formed on the piezoelectric substrate.

8. The elastic convolver according to claim 5, wherein said piezoelectric thin film is a piezoelectric thin film composed of one type of ZnO, $Ta_2O_5$ and CdS.

9. The elastic convolver according to claim 5, wherein letting H be the thickness of said piezoelectric thin film and λ be the wavelength of surface acoustic waves which are propagated, H/λ is in the range of 0.08 to 0.3.

10. The elastic convolver according to claim 9, wherein areas where said piezoelectric thin films are formed are areas where said set of input interdigital transducers is formed on the piezoelectric substrate.

11. The elastic convolver according to claim 9, wherein areas where said piezoelectric thin films are formed are areas where said set of input interdigital transducers and said multistrip couplers are formed on the piezoelectric substrate.

12. The elastic convolver according to claim 9, wherein said piezoelectric thin film is a piezoelectric thin film composed of one type of ZnO, $Ta_2O_5$ and CdS.

13. The elastic convolver according to claim 1, wherein said piezoelectric thin films cover a surface of said piezoelectric substrate except for said waveguide path.

* * * * *